United States Patent [19]

Cavaliere et al.

[11] 4,287,435
[45] Sep. 1, 1981

[54] COMPLEMENTARY TRANSISTOR INVERTING EMITTER FOLLOWER CIRCUIT

[75] Inventors: Joseph R. Cavaliere, Hopewell Junction; Robert A. Henle, Clinton Corners; Richard R. Konian, Poughkeepsie; James L. Walsh, Hyde Park, all of N.Y.

[73] Assignee: International Business Machines Corp., Armonk, N.Y.

[21] Appl. No.: 82,254

[22] Filed: Oct. 5, 1979

[51] Int. Cl.³ .................. H03K 17/60; H03K 3/26
[52] U.S. Cl. .................. 307/255; 307/270; 307/455
[58] Field of Search ............ 307/270, 246, 255, 214, 307/215

[56] References Cited

U.S. PATENT DOCUMENTS

| | | | |
|---|---|---|---|
| 3,433,978 | 3/1969 | Bongenaar et al. | 307/214 |
| 3,458,719 | 7/1969 | Weiss | 307/203 |
| 3,509,363 | 4/1970 | Jen et al. | 307/203 |
| 3,614,467 | 10/1971 | Tu | 307/215 |
| 3,798,471 | 3/1974 | Williams et al. | 307/270 |
| 3,854,057 | 12/1974 | Williams et al. | 307/270 |
| 3,987,310 | 10/1976 | Peltier et al. | 307/215 |
| 4,006,365 | 2/1977 | Marzin et al. | 307/214 |
| 4,045,689 | 8/1977 | Tietz | 307/270 |
| 4,053,792 | 10/1977 | Cannistra et al. | 307/215 |
| 4,064,405 | 12/1977 | Cricchi et al. | 307/214 |
| 4,065,678 | 12/1977 | Reese et al. | 307/214 |

OTHER PUBLICATIONS

"Nonsaturating, Low Source Impedance, Complementary Driver", P. D. Bellamy et al., IBM Tech. Dsclre Bttn., vol. 10, No. 5, 10/67, pp. 672-673.

T²L Compatible Push-Pull Drivers", W. B. Chin, IBM Tech. Dsclre Bttn., vol. 14, No. 8, 1/76, p. 2289.

Primary Examiner—Stanley D. Miller, Jr.
Assistant Examiner—B. P. Davis
Attorney, Agent, or Firm—Robert J. Haase

[57] ABSTRACT

A complementary bipolar transistor circuit characterized by the same output impedance for positive and negative input voltage transitions, only a single collector path delay between input and output for both senses of input voltage transitions and very low standby power consumption. Provision is made for simultaneously actuating an emitter follower series-connected first pair of complementary transistors with signals having voltage swings which are only a fraction of the $V_{be}$ necessary to forward bias each base-emitter diode of the first pair of transistors. The actuation is accomplished using a second pair of complementary transistors having collector electrodes connected to respective bases of the first pair of transistors of similar kind. One of the remaining electrodes of each of the second pair of transistors are connected to each other.

In a driver circuit species of the invention, the bases of the second pair of transistors are connected to each other and receive the input signal. In a logic circuit species of the invention, the emitter of one of the second pair of transistors is connected to the base of the other of the second pair of transistors. NOR logic is performed by connecting additional transistors in parallel with said one of the second pair of transistors, the bases of the additional transistors receiving respective logic input signals. The output from the driver circuit as well as from the logic circuit is derived from the commonly connected emitters of the first pair of transistors. The first pair of transistors conduct only during the transitions of the input signals.

6 Claims, 2 Drawing Figures

COMPLEMENTARY TRANSISTOR INVERTING EMITTER FOLLOWER CIRCUIT

BACKGROUND OF THE INVENTION

1. Field of the Invention

The invention generally relates to emitter follower circuits utilizing complementary bipolar transistors and, more particularly, to such circuits characterized by low power consumption and high speed in responding to input signal transitions of either increasing or decreasing sense.

2. Description of the Prior Art

As is well known, a capacitively loaded emitter follower circuit using complementary transistors such as shown, for example, in FIG. 8-36 on page 304 of the text *Pulse, Digital and Switching Waveforms*, by J. Millman and H. Taub, McGraw Hill, 1965, provides an output waveform having rising edges and falling edges that follow (with comparable speed) the corresponding rising and falling edges of the input waveform. In the example given, however, the bases of the series-connected complementary transistors are driven by the same input waveform whose voltage excursions turn each transistor on and off.

This necessitates a relatively large input voltage excursion, at least equal to the sum of the $V_{be}$'s for forward biasing the emitter-base junctions of the two transistors, and represents a significant power expenditure.

It is desirable that a way be found to actuate the complementary emitter follower circuit using voltage excursions which are only a fraction of the sum of the two $V_{be}$ voltages so that power dissipation, especially within large scale integrated circuits, may be minimized. It is also desirable that such actuation be achieved without compromising the response speed of the circuit.

SUMMARY OF THE INVENTION

A first pair of complementary bipolar transistors connected in emitter follower configuration is driven by a second pair of complementary transistors. The collectors of the second pair provide signals to the bases of the first pair. The signals have d.c. levels offset from each other with each signal level being substantially at the value which switches the respective transistor of the first pair on and off. The excursion of each signal is only a fraction of the $V_{be}$ necessary to forward bias each emitter-base junction of the first pair of transistors.

In a driver circuit species of the invention, the bases of the second pair of transistors are connected to each other and receive the input driving signal.

In a NOR logic circuit species of the invention, the emitter of one of the second pair of transistors is connected to the base of the other of the second pair of transistors and receives one of the input logic signals. Additional transistors are connected in parallel with said one of the second pair of transistors, the bases of the additional transistors receiving the remaining input logic signals. The output from both the driver circuit and the logic circuit is derived from the commonly connected emitters of the first pair of transistors.

DESCRIPTION OF THE PREFERRED EMBODIMENTS

Figure 1:
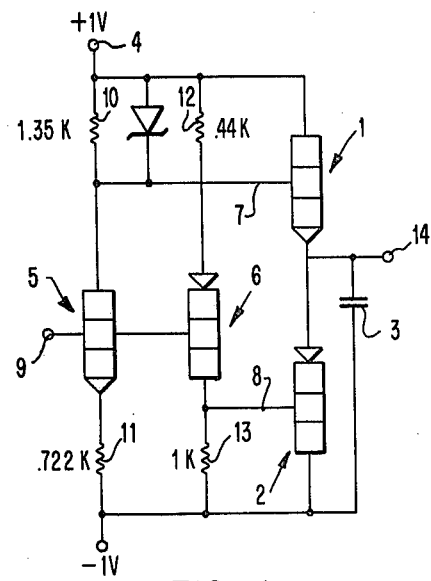
FIG. 1 is a schematic diagram of the driver circuit species of the invention.

Referring to FIG. 1, a pair of complementary transistors 1 and 2 are series connected to form an emitter follower circuit of the type shown in FIG. 8-36 of the previously cited Millman and Taub book having a capacitive load represented by the capacitor 3. Capacitor 3 is connected to the emitters of NPN transistor 1 and PNP transistor 2 which constitute the output terminal of the emitter follower circuit. The collector of transistor 1 is connected to a source of positive potential applied to terminal 4.

In accordance with the prior art technique described in the Millman and Tuab book, the bases of transistors 1 and 2 are jointly connected to a common input signal source. The input voltage undergoes a relatively large excursion from an upper positive value (sufficient to turn on transistor 1 to charge capacitor 3) to a lower positive value (sufficient to turn on transistor 2 after capacitor 3 has been charged to a value $V_{be}$ below the upper voltage excursion). Thus, the total input voltage excursion must be at least equal to twice $V_{be}$ of the transistors 1 and 2. Although the use of PNP transistor 2 instead of a simple transistor minimizes power dissipation in that transistors 1 and 2 conduct substantially only during respective input voltage transitions, the required input voltage excursion is undesirably large and constitutes a significant power expenditure in large scale integrated circuits. The result is that the increased speed in which the output voltage across capacitive load 3 follows the downward input voltage excursion, made possible through the use of PNP transistor 2 in lieu of a simple resistor, is compromised by paying the price of the input signal power required.

The present invention, however, realizes the performance advantages of using the complementary transistor emitter follower circuit comprising transistors 1 and 2 while requiring on input voltage excursion which is only a fraction of $V_{be}$ by use of transistors 5 and 6. NPN transistor 5 and PNP transistor 6 provide a pair of in-phase pulses on lines 7 and 8 in response to an input pulse of opposite phase at terminal 9. The voltage excursions on lines 7 and 8 are substantially equal to a fraction of $V_{be}$ but are d.c. offset from each other by the sum of the $V_{be}$'s of the NPN and PNP devices at their thresholds of conduction, so that the excursions on lines 7 are centered about the conduction threshold of transistor 1 whereas the excursions on line 8 are centered about the conduction threshold of transistor 2. The d.c. levels are set by selection of suitable values for the voltage applied to terminal 4 and for resistors 10, 11, 12 and 13 which determine the operating potentials applied to the collector and emitter electrodes of transistors 5 and 6. The base electrodes of transistors 5 and 6 jointly receive the input signal applied to terminal 9.

It will be noted that only one collector path delay separates input terminal 9 from output terminal 14 for positive as well as negative-going transitions of the input signal at input terminal 9. Negative-going transitions of the input signal are inverted by transistor 5 to turn on transistor 1 and charge capacitive load 3 to a potential one $V_{be}$ below the signal on line 7. Similarly, positive-going input signal transitions are inverted by transistor 6 to turn on transistor 2 and discharge capacitive load 3. When a high performance PNP is selected for transistor 6, approaching the performance of NPN transistor 5, the potential at output terminal 14 responds to the positive going transitions at input terminal 9 with the same high speed with which the negative-going input transitions are followed. Conduction of transistors 1 and 2 occurs substantially only at times when capacitive load 3 is being charged and discharged, respectively.

The circuit of FIG. 1 functions as a high speed, low power driver circuit. If logic also is desired to be performed, it is necessary to provide separate input terminals at which separate input logic signals can be applied. Thus, the common input terminal connection to the bases of transistors 5 and 6 can not be used. The circuit of FIG. 2 alters the input connection of the PNP transistor, corresponding to transistor 6 of FIG. 1, in order that NOR logic can be performed without significantly compromising the desirable operational properties of the circuit of FIG. 1.

Figure 2:
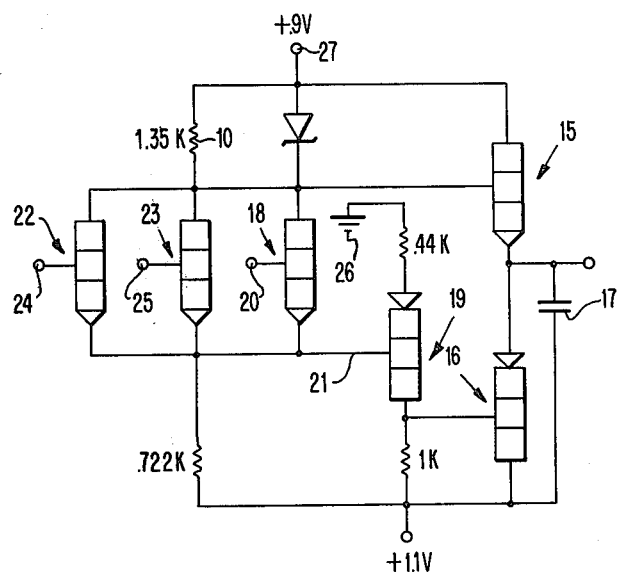
FIG. 2 is a schematic diagram of the logic circuit species of the invention.

Referring to FIG. 2, the connections and operation of transistors 15 and 16 and capacitive load 17 correspond to those of transistors 1 and 2 and capacitive load 3 of FIG. 1. The collectors of transistors 18 and 19 are connected to the bases of transistors 15 and 16, respectively, in the same manner relative to transistors 5 and 6 and transistors 1 and 2 of FIG. 1. However, only the base of transistor 18 directly receives and input logic signal applied to input terminal 20. The base of transistor 19 receives its input signal from line 21 to which the emitters of transistor 18 as well as transistors 20 and 23 are coupled. The bases of transistors 22 and 23 receive respective logic signals applied to input terminals 24 and 25. The collector and emitter electrodes of transistors 22 and 23 are connected in parallel with those of transistor 18.

The operation of the logic circuit of FIG. 2 is similar to that of the driver circuit of FIG. 1 in response to an input signal transition appearing at anyone of the input terminals 20, 25 and 24 with the exception that an additional small delay is introduced in the speed with which positive input transitions are followed. This slight delay results from the fact that PNP transistor 19 receives its input signal from the base-emitter paths of transistors 18, 23 and 22 rather than directly from the input terminals, as is the case with corresponding PNP transistor 6 of FIG. 1. Additionally, it is necessary to provide a separate voltage or a Thevinin supply at terminal 26 which is one $V_{be}$ less that the voltage applied to terminal 27. This makes allowance for the level shift at the base of transistor 19 due to the $V_{be}$ input signal shift through each base-emitter path of transistors 18, 23 and 22.

The circuit parameter values shown adjacent the respective elements in the Figures are presently preferred for optimum performance and noise margin.

Having thus described by invention, what I claim as new, and desire to secure by Letters Patent is:

1. A complementary transistor, inverting emitter follower circuit comprising:

a series-connected first pair of bipolar complementary transistors, the emitter electrodes of said first pair of transistors being connected together and to an output terminal, a second pair of complementary bipolar transistors, the collector electrodes of said second pair of transistors being directly connected to respective bases of said first pair of transistors of similar kind, one of the remaining electrodes of said second pair of transistors being connected together, at least one base of said second pair of transistors being connected to an input terminal, and means connected to the collectors and emitters of said second pair of transistors and to the collectors of said first pair of transistors for biasing said first and second pairs of transistors.

2. The circuit defined in claim 1 wherein said output terminal is connected to a capacitive load.

3. The circuit defined in claim 2 wherein the bases of said second pair of transistors are directly connected together.

4. The circuit defined in claim 2 wherein the emitter of one and the base of the other of said second pair of transistors are directly connected together.

5. The circuit defined in claim 4 wherein said means for biasing said transistors includes means for separately biasing the emitter of the PNP transistor of said second pair of transistors.

6. The circuit defined in claim 4 and further including additional transistors connected in parallel with the NPN transistor of said second pair of transistors, separate logic input signals being applied to the bases of said additional transistors and of said NPN transistor.

* * * * *